(12) United States Patent
Peterson et al.

(10) Patent No.: US 7,290,188 B1
(45) Date of Patent: Oct. 30, 2007

(54) METHOD AND APPARATUS FOR CAPTURING THE INTERNAL STATE OF A PROCESSOR FOR SECOND AND HIGHER ORDER SPEEPATHS

(75) Inventors: Spencer A. Peterson, Austin, TX (US); Richard J. Wilcox, Austin, TX (US); Michael P. Taborn, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 385 days.

(21) Appl. No.: 10/930,157

(22) Filed: Aug. 31, 2004

(51) Int. Cl.
*G01R 31/28* (2006.01)
(52) U.S. Cl. .................................................. 714/724
(58) Field of Classification Search ................ 714/724, 714/726, 727, 736; 324/765
See application file for complete search history.

(56) References Cited

U.S. PATENT DOCUMENTS

| 5,430,305 | A |  | 7/1995 | Cole, Jr. et al. |
| 5,991,888 | A |  | 11/1999 | Faulkner et al. |
| 6,078,183 | A |  | 6/2000 | Cole, Jr. |
| 6,127,858 | A | * | 10/2000 | Stinson et al. ................. 327/99 |
| 6,137,304 | A | * | 10/2000 | Nikawa ....................... 324/765 |
| 6,546,513 | B1 |  | 4/2003 | Wilcox et al. |
| 6,922,650 | B2 |  | 7/2005 | Sato |

* cited by examiner

*Primary Examiner*—James C. Kerveros
(74) *Attorney, Agent, or Firm*—Meyertons Hood Kivlin Kowert & Goetzel, P.C.; Erik A. Heter

(57) ABSTRACT

A method and apparatus for capturing the internal state of an integrated circuit (IC) for second and higher order speedpath-induced failures. The method includes stretching one or more cycles of an internal clock signal in order to mask a first order speedpath-induced failure (SIF), wherein the internal clock signal is restored to operating at a normal speed subsequent to masking the first order SIF. The internal clock signal may be stopped at a cycle corresponding to a higher order SIF. After stopping the internal clock signal, test output data may be loaded into a scan chain. The method may also be used in conjunction with a laser or other device for other test enhancements.

44 Claims, 13 Drawing Sheets

Dummy Stretch Mode

Custom Stretch Mode

Dummy Stretch Mode Combined with Stop Mode

~ 600

| Clock Cycle | | DUT Behavior |
|---|---|---|
| | | |
| | | |
| 5000 | | |
| 5001 | | |
| 5002 | | Internal Failure #1 |
| 5003 | | |
| 5004 | | |
| 5005 | | Pin Failure #1 |
| 5006 | | |
| 5007 | | |
| 5008 | | |
| 5009 | | |
| 5010 | | |
| 5011 | | Internal Failure #2 |
| 5012 | | |
| 5013 | | |
| 5014 | | Pin Failure #2 |
| | | |
| | | |
| | | |

Figure 6

METHOD AND APPARATUS FOR CAPTURING THE INTERNAL STATE OF A PROCESSOR FOR SECOND AND HIGHER ORDER SPEEPATHS

BACKGROUND OF THE INVENTION

1. Field of the Invention

This invention relates to integrated circuits, and more particularly, to methods for revealing speedpaths during the debugging of integrated circuits.

2. Description of the Related Art

One objective of microprocessor designers is to increase the clock speed at which a given processor design can operate. Characterization tests may be run to quantify the speed-limiting aspects of a microprocessor design. The circuits that limit the operating clock speed may then be re-designed, resulting in a new revision of the processor that may operate at the desired clock speed.

In order to increase the clock speed at which a processor (or other type of integrated circuit) operates, those areas of the design that prevent operating at a higher speed must be determined. Such areas may be identified by testing for failures associated with what are known as "speedpaths". A speedpath-induced failure (hereafter 'SIF') is known as a failure that occurs when operating the processor at a frequency that would otherwise not fail when operating the processor at a lower frequency. A SIF occurs when data is unable to propagate through the combinational logic from one storage element (e.g. flip-flop) to the next within a given clock period. If the data is unable to reach the next storage element within the given clock period, incorrect data is forwarded to other portions of the processor, causing a failure. The propagation delay could be caused by an excessive amount of logic between storage elements or parasitic parameters in the data path inhibiting the propagation of the data. The top data paths that define the minimum clock period that can be used without causing a SIF are known as speedpaths.

One type of testing for SIFs involves the inputting to a device under test one or more test patterns over several iterations while increasing the clock speed for each iteration until the part fails. A first SIF resulting from testing of this type is known as a first order SIF. In some cases, testing may be terminated after finding a first order SIF, since any processor operation that occurs subsequent to the failure corresponding to the first order SIF is potentially corrupted by the first order speedpath.

During tests such as that described above, it may be desirable to find additional (or higher order) SIFs. This may be accomplished by momentarily slowing down the clock speed in order to mask lower order SIFs (sometimes referred to as "cycle stretching"). For example, assume a given test pattern includes 10,000 clock cycles and a fault corresponding to a first order speed path occurs during the $9000^{th}$ clock cycle. In such a case, the first order SIF may be masked by slowing the clock down at the $9000^{th}$ clock cycle to a frequency at which the failure does not occur. After the $9000^{th}$ clock cycle, testing at the normal clock frequency may be resumed until the next failure occurs, which corresponds to a second order SIF. The process may be repeated to mask the first and second order SIFs in order to find a third order speedpath, and may be repeated for higher order SIFs as well.

One drawback to such testing is that it is difficult to obtain certain types of data (e.g., logic values) for SIFs higher than first order. For first order SIFs, internal data may be captured by what is known as a scan dump. A scan dump involves capturing logic values into a scan chain. A scan chain includes a plurality of scan elements. Logic values captured in a scan chain may be serially shifted out of the chain for observation. Both cycle stretching to mask lower order speedpaths and scan dumping involve clock manipulation. As noted above, cycle stretching involves changing the clock frequency for one or more cycles. Various embodiments of scan dumping require the clock to be completely stopped. Combining these techniques may be difficult, and thus it is often times only practical to perform scan dumping for a first order speedpath. However, data from a scan dump may be required in order to determine what is needed to correct problems that may be associated with any higher order speedpaths that prevent the processor from operating at higher clock speeds. Thus, a new silicon revision may be required for correcting each speedpath that is higher than the first order speedpath. The requirement of a new silicon revision in order to correct each speedpath may significantly increase the amount of time and money spent in designing the processor to operate at a higher clock speed.

SUMMARY OF THE INVENTION

A method and apparatus for capturing the internal state of an integrated circuit (IC) for second and higher order speedpath-induced failures (SIF) is disclosed. In one embodiment, the method includes stretching one or more cycles of an internal clock signal in order to mask a first order speedpath-induced failure, wherein the internal clock signal is restored to operating at a normal speed subsequent to masking the first order SIF. The internal clock signal may be stopped at a cycle corresponding to a higher order SIF. After stopping the internal clock signal, test output data may be loaded into a scan chain.

In one embodiment, a test system is coupled to a device under test (DUT). The DUT includes a clock generation unit and a clock manipulation unit. The clock generation unit is configured to generate the internal clock signal which is provided to a clock grid in the DUT, wherein the clock grid supplies various clocked storage elements. The clock manipulation unit is configured to, in a first mode, provide the internal clock signal to the DUT at a normal speed. In a second mode, the clock manipulation unit is configured to "stretch", or provide the internal clock signal to the DUT at a lower speed. In a third mode, the clock manipulation unit may also stop the internal clock signal from being provided to the clock grid of the DUT. During operation of the test system, the clock manipulation unit can alternate between the three modes as necessary.

The test system may further include a laser configured to project a laser beam onto an area of the DUT, thereby providing localized heating. Testing using both localized heating and clock stretching techniques simultaneously may be performed on the DUT by the test system. In addition to its ability to provide localized heating, the laser may be used for other purposes as well, such as the generation of electron hole pairs, which may also be used to identify SIFs.

Testing may also be performed in an "inverse" stretch mode, (or cycle shrink mode). In this mode, a plurality of cycles of the internal clock signal provided to the clock grid may be stretched. An unstretched clock pulse may be provided to the clock grid at a cycle that corresponds to a SIF of interest. This may be used to locate or verify the occurrence of the SIF at the particular clock cycle that is unstretched.

BRIEF DESCRIPTION OF THE DRAWINGS

Other aspects of the invention will become apparent upon reading the following detailed description and upon reference to the accompanying drawings in which:

FIG. 6 is a diagram illustrating one embodiment of a test sequence;

Figure 1:
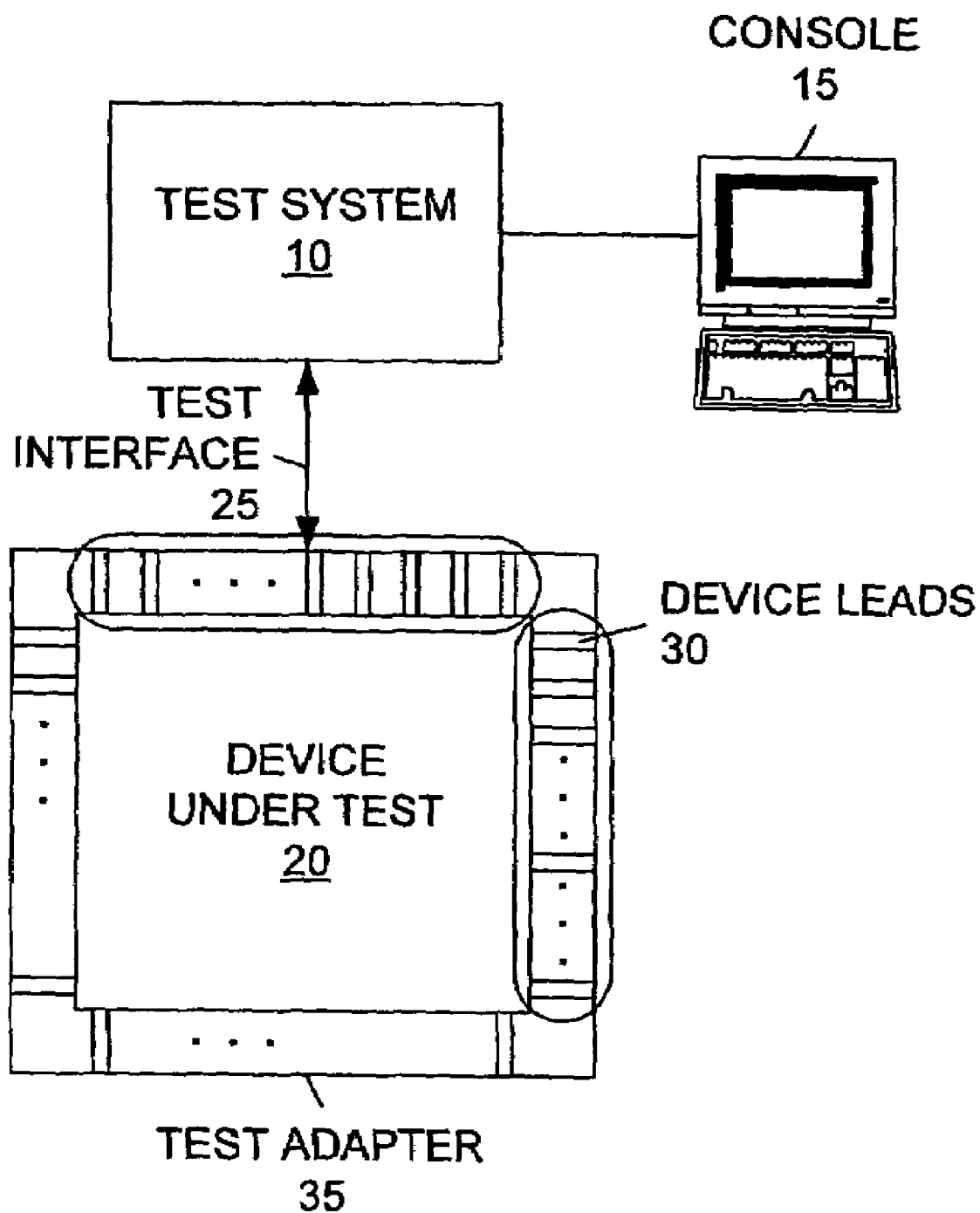
FIG. 1 is a drawing of one embodiment of a test system and a device under test.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a drawing of one embodiment of a test system and a device under test (DUT) is shown. Test system 10 is coupled to DUT 20 through test interface 25 and test adapter 35. A user console 15 is also coupled to test system 10.

Test adapter 35 may be a specialized test socket which is designed specifically for DUT 20 or may be a general purpose test socket. Test adapter 35 is typically used to provide connections from test system 10 for input and output signals, including clock signals, to each of the device leads 30 on DUT 20.

In the embodiment shown, test system 10 is a complex computerized test system which may contain one or more processors, banks of random access memory (RAM), read only memory (ROM), and mass storage devices, such as hard disk drives. Test system 10 may be programmed through user console 15 to run test programs written in any suitable programming language.

A test program is typically used for communications between test system 10 and DUT 20. The test program may include instructions that, when executed, pre-condition DUT 20. The code may pre-condition DUT 20 by varying such device parameters as the input voltage and input clock frequency, among others. To communicate with DUT 20, tester files, commonly referred to as test patterns, are used. Test patterns are comprised of test vectors, where each vector may direct test system 10 as to when to apply specific stimuli to the inputs of DUT 20 and when to monitor the outputs from DUT 20. Thus, execution of the test program may pre-condition DUT 20 and then call a particular test pattern. Test vectors may cause DUT 20 to operate in various modes.

Test system 10 may be used to analyze failures caused by speedpaths (as previously noted, SIFs, or speedpath induced failures). For the purposes of this disclosure, a SIF is a failure or malfunction that occurs in a circuit when operating a clock to that circuit at a frequency that would otherwise not occur when the clock is operated at a lower frequency, while the speedpath is a data path related to the failure. For example, a SIF may occur for a particular circuit in a processor when operating the processor at a clock frequency of 2 gigahertz, where the same circuit may function properly at a frequency such as 1 gigahertz. A first order speedpath is defined as the speedpath related to the first SIF encountered when sequentially running test vectors in a test pattern. Any processor state occurring after the first SIF is considered invalid if the SIF is not masked (techniques of which will be discussed in further detail below), since any subsequent instructions may be corrupted as a result of the first SIF. Similarly, a second order speedpath is defined as the speedpath associated with a second SIF that occurs on a test vector subsequent to the first SIF in the same test pattern. A third order speedpath is the speedpath related to a third SIF that occurs on a test vector subsequent to the second SIF in the same test pattern, and so on. Thus, for the purposes of this disclosure, a higher order speedpath is defined as a speedpath associated with a $2^{nd}$ or later SIF that occurs during testing.

Higher order speedpaths may be exposed by a technique known as cycle stretching. Cycle stretching involves slowing down the clock for one or more clock cycles associated with any speedpaths of an order lower than the speedpath that is to be exposed. By slowing down the clock, the speedpath may effectively be masked (and thus an associated SIF be prevented for the test cycle) by temporarily operating the circuit at a clock frequency (e.g., a lower frequency) where the associated circuit functions properly.

A SIF occurs when data is unable to propagate through the combinational logic from one storage element (e.g. flip-flop) to the next within a given clock period. If the data is unable to reach the next storage element within the given clock period, incorrect data is forwarded to other portions of the processor, thereby causing a failure. The propagation delay could be caused by an excessive amount of logic between storage elements or parasitic parameters in the data path inhibiting the propagation of the data. Test system 10 may identify related speedpaths and allow the causes of SIFs to be analyzed by capturing the state of logic values within DUT 20. In one embodiment, DUT 20 includes one or more internal scan chains. Upon the occurrence of a SIF, logic states stored in the storage elements of the processor may be loaded into the scan chain(s) and subsequently shifted out of DUT 20 into test system 10 where they can be analyzed. Test system 10 can be used to capture the internal state of DUT 20 for a speedpath of any order.

Figure 2:
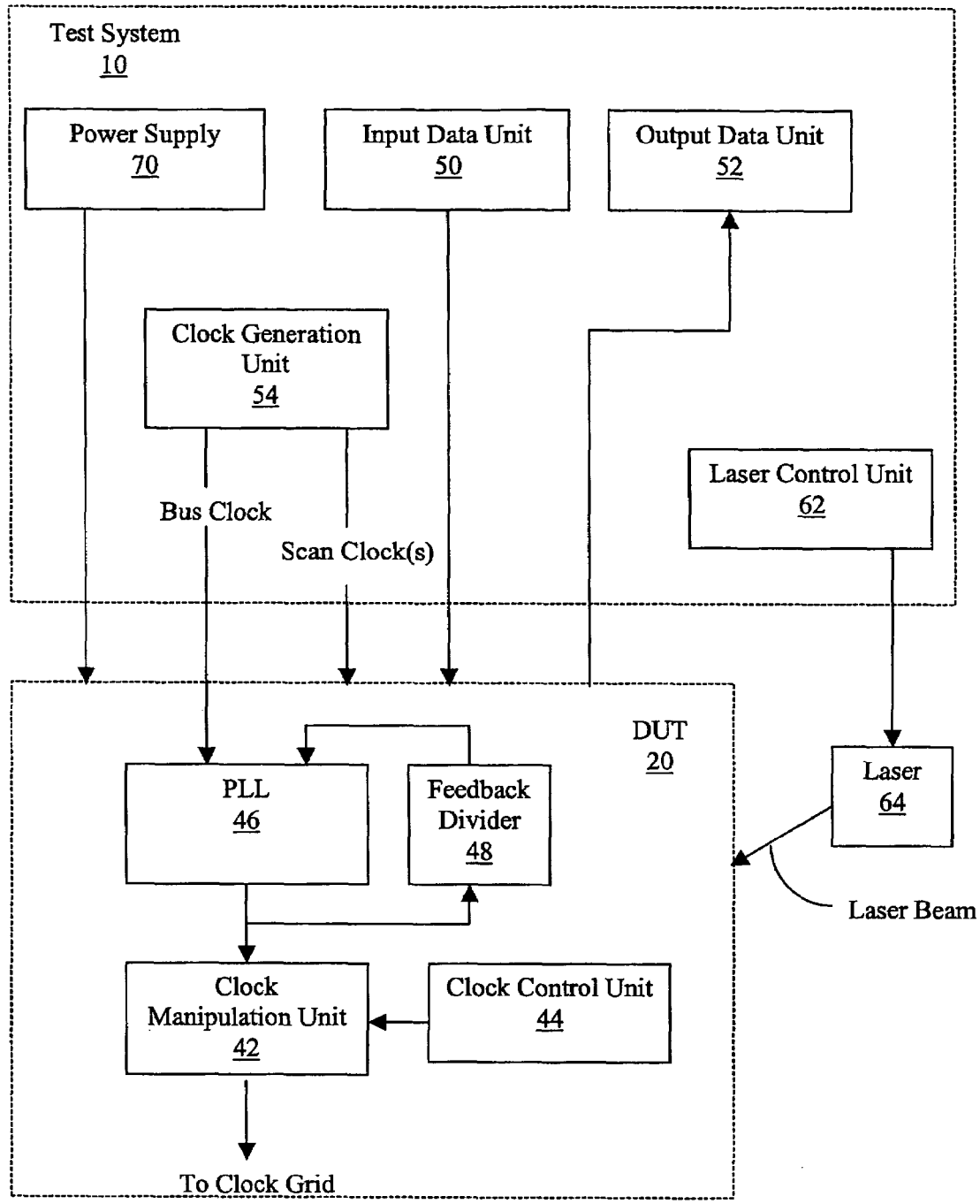
FIG. 2 is a block diagram of one embodiment of a test system and a device under test.

Moving now to FIG. 2, a block diagram of one embodiment of a test system and a device under test is shown. In the embodiment shown, test system 10 is configured to perform tests on DUT 20. Test system 10 is coupled to provide and receive various signals to DUT 20. Signals provided by test system 10 to DUT 20 include input data (from test vectors) and a reference clock signal. Signals received from DUT 20 by test system 10 include output data. Test system 10 also includes power supply 70 for providing power to DUT 20.

Test system 10 includes circuitry for generating and controlling a reference clock signal (hereafter, the bus clock signal) that is provided to DUT 20 during test operations. Clock generation unit 54 is configured to generate the bus clock signal that is then input into a phase locked loop (PLL) 46, internal to DUT 20. The bus clock signal input into PLL 46 of DUT 20 is used as a reference clock signal in order to ensure synchronous operation.

PLL 46 is configured to generate an internal clock signal that may be provided to the various clocked logic circuits within DUT 20 through a clock grid. The internal clock signal may be a multiple of the bus clock signal, such as 10× in one embodiment. Furthermore, PLL 46 may be configurable to allow the multiple to be user-defined, allowing the frequency of the internal clock signal to be changed without changing the frequency of the bus clock signal.

As previously noted, PLL 46 is coupled to receive the bus clock signal provided by clock generation unit 54 as one input when DUT 20 is coupled to test system 10. PLL 46 is also coupled to receive a feedback clock signal from its output as another input. Feedback divider 48 is located in the feedback path, and it configured to receive the internal clock signal as an input. Since the internal clock signal is a multiple of the bus clock signal, feedback divider 48 divides the internal clock signal by a value equal to the multiple. Thus, the clock signal provided to the feedback input of PLL 46 is approximately equal in frequency to the bus clock signal. PLL 46 compares the phase relationship between the feedback clock signal and the bus clock signal in order to maintain a stable output clock signal (i.e. the internal clock signal).

It should be noted here that while DUT 20 uses a PLL for generation of an internal clock signal for this embodiment, other types of clock generation units are possible and contemplated. For example, embodiments implementing clock generation circuitry such as a bi-stable multivibrators or crystal oscillators are also possible and contemplated.

Clock manipulation unit 42 is controlled by clock control unit 44, which provides control of the various clocking modes. In one embodiment, clock control unit 44 is a programmable unit and may include registers and other circuitry which may be programmed to cause the internal clock cycle to be stretched (i.e. temporarily slowing the internal clock frequency) or stopped. During stretches of the internal clock cycle, the bus clock signal provided to DUT 20 from test system 10 may also be stretched in order to maintain synchronous and stable operation for PLL 46. However, the stretching of the bus clock is not itself controlled by clock manipulation unit 42.

Clock control unit 44 is coupled to provide control signals to clock manipulation unit 42. The specific signals provided by clock control unit 44 are dependent upon its programming. The various modes of operation for clock control circuit 44 will be discussed below in reference to FIG. 3 through FIG. 5C.

Test vectors may be input into DUT 20 from input data unit 50. The exact values of the test vectors may be programmed into test system 10 through a user console such as user console 15 shown in FIG. 1. Test vectors may be input into DUT 20 through any of its input pins. Thus, input data unit 50 may include a plurality of connections to DUT 20 and may simultaneously input a plurality of stimuli.

Test system 10 includes clock generation unit 54, which is configured to generate the bus clock signal provided to DUT 20. Clock generation unit 54 is further configured to generate a scan clock(s) which allows the shifting of output data to the output data unit 52 upon completion of a test. Test system 10 is configured to allow analysis of output data received by the output data unit 52 upon completion of a test routine.

Test system 10 also includes laser control unit 62 and laser 64. Laser control unit 62 is configured to control laser 64. Laser 64 may be used in conjunction with test system 10 during test operations in various ways. In one embodiment, laser 64 is configured to provide localized heating of DUT 20 during test operations. Embodiments utilizing other types of sources for providing localized heating are possible and contemplated. In another embodiment, laser 64 may be used to create electron hole pairs on portions of the circuitry of DUT 20.

During test operations involving localized heating, a laser beam produced by laser 64 may be projected onto an area of DUT 20. The laser may cause an increased amount of heat in the area of DUT 20 exposed to the laser beam. Since most of the operational characteristics of transistors typically degrade at higher temperatures, the localized heating proved by the laser beam may induce a SIF that may otherwise not occur if there were no localized heating. As a result, heat from laser 64 allows these heat and speed sensitive areas to be identified so that future revisions of the design can be optimized for speed.

Laser control unit 62 is configured to adjust the intensity of laser 64. Repeated tests with varying intensities provided by laser 64 may aid in characterizing a specific defect. Laser control unit 62 may also control the manner in which laser 64 focuses on DUT 20. For example, laser control unit 62 may cause laser 64 to sweep the laser source across the entirety of DUT 20 during a given test, or may cause laser 62 to focus the source on a specific area of DUT 20.

It should be noted here that while we discuss using a laser for localized heating, other laser byproducts are possible and contemplated. As noted above, embodiments implementing lasers to create electron hole pairs are also possible and contemplated. Electron hole pairs may be created by operating the laser at a wavelength different than that used to provide localized heating. The creation of electron hole pairs may alter the performance characteristics of the circuitry or device (e.g., a transistor) upon which the laser beam is projected. In some cases, the creation of electron hole pairs may improve the performance of the device. In the case of improved performance, a user may be able to identify the circuitry which causes a SIF. In a first iteration, a test of DUT 20 may be conducted at a frequency in which a SIF occurs. In a second iteration, the test of DUT 20 may be conducted at the same frequency (as in the first iteration), with the laser beam projected onto circuitry suspected of causing the SIF. If the laser beam has the proper wavelength, electron hole pairs may be created, and may improve the performance of the circuitry such that it no longer causes a SIF at that frequency. This may indicate that such circuitry is the cause of the SIF when operated at that frequency without the presence of laser-induced electron hole pairs.

Additional details of combining the use of a laser for localized heating and other techniques for exposing and capturing data related to $2^{nd}$ and higher order speedpaths will be discussed below.

Figure 3:
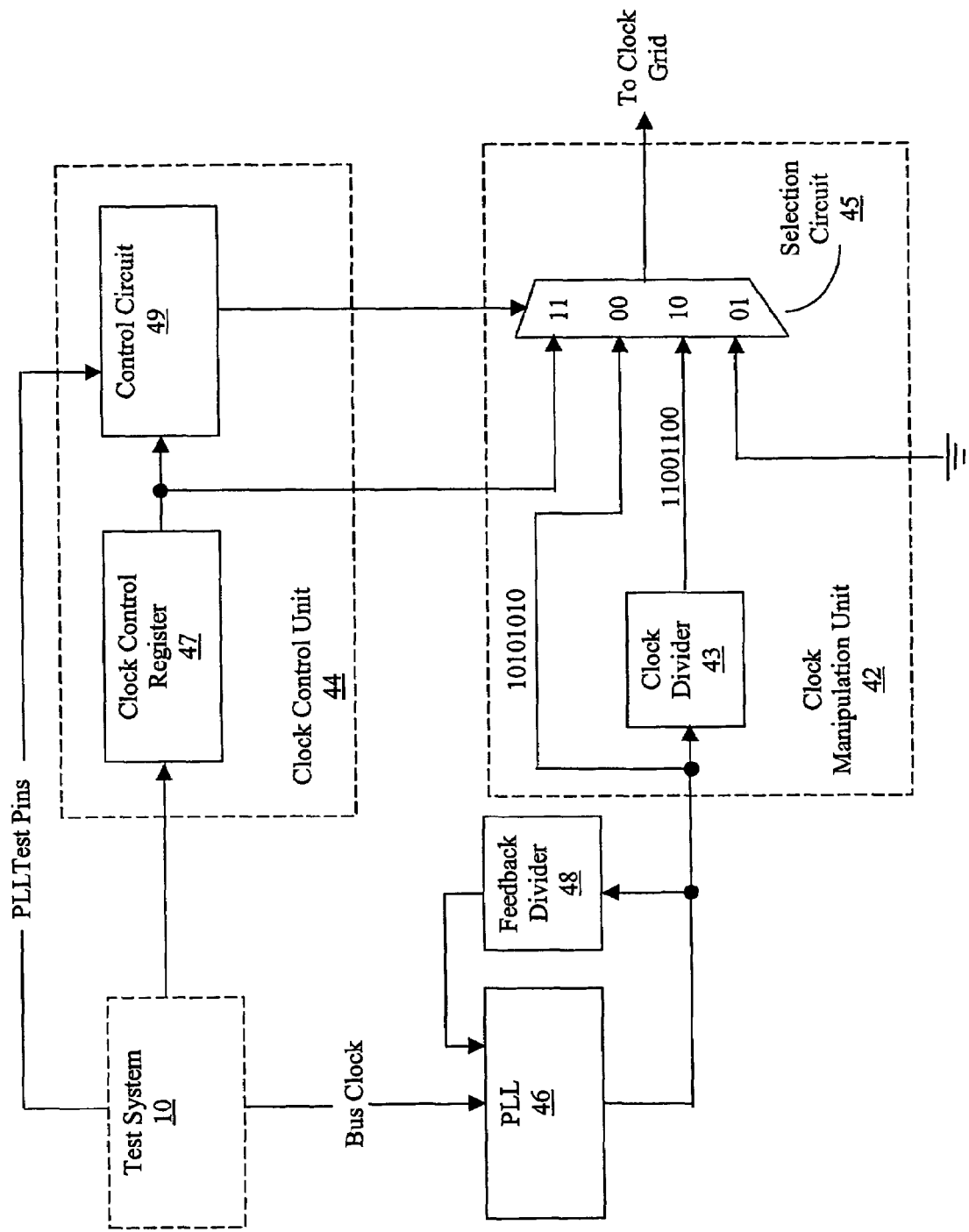
FIG. 3 is a block diagram further illustrating one embodiment of the clocking circuitry.

FIG. 3 is a block diagram further illustrating one embodiment of the clocking circuitry. The clocking circuitry shown is one possible embodiment of the clock circuitry included in DUT 20, and its corresponding units are numbered the same here for simplicity.

In the embodiment shown, PLL 46 is coupled to provide a clock signal to clock manipulation unit 42, which includes clock divider 43 and selection circuit 45. PLL 46, as previously noted, is a phase locked loop that generates a clock signal that is a multiple of the bus clock signal received by DUT 20 from test system 10. Clock divider 43 is coupled to receive the clock signal from PLL 46 and may provide a divided output clock signal. In this particular embodiment, the output clock signal from clock divider 43 is one half the frequency of the input clock signal. Embodiments wherein the clock signal is divided by three (i.e. the output clock signal is ⅓) of the clock signal, four, or any other divisor are possible and contemplated.

Clock manipulation unit 42 includes a selection circuit 45, which is coupled to receive the clock signal from PLL 46 and the divided clock signal from clock divider 43. Selection circuit 45 also includes one input that is, in this embodiment, tied to ground, and another user defined input from clock control register 47. Depending on the selection inputs, selection circuit 45 will provide as an output the clock signal from PLL 46, the divided clock signal, a user defined clock signal, or no clock signal. It should be noted that embodiments are possible and contemplated wherein clock divider 43 produces multiple different clock signals and wherein selection circuit 45 is coupled to select from a greater number of inputs than shown here. Selection circuit 45 is configured to provide an output clock signal (the internal clock) to the device under test. It is also noted that some embodiments of FIG. 3 may be configured to provide multiple internal clock signals.

Clock manipulation unit 42 is controlled by clock control unit 44. In the embodiment shown, clock control unit 44 is coupled to provide the selection signals to selection circuit 45. The state of the selection signals may be set by control circuit 49. Control circuit 49 is coupled to clock control register 47, which defines the manner in which the clock is to be controlled. Control circuit 49 is also coupled to test system 10, which defines when to change the control input to selection register 45. In particular, test system 10 is coupled, in this embodiment, to provide signals to a plurality of PLL test pins coupled to control circuit 49. The PLL test pins may be used to define when during the test sequence the clock control circuit 49 should change the selection circuit, thereby changing which clock mode is forwarded to the clock grid. The PLL test pins, in conjunction with the clock control register 47 may also determine which of the various clocking modes are forwarded to the clock grid. In one embodiment, one pin may be used for dummy stretch mode while another is used for custom stretch mode. Clock control register 47 is user programmable, and can be used to store and provide information defining the customizable shape of the clock waveform that could be forwarded to the clock grid when selected to do so.

Additional details of the PLL test pins for this particular embodiment will be discussed in further detail below. It should also be noted that the embodiment shown in FIG. 3 using the PLL test pins is exemplary and other embodiments are possible and contemplated.

Figure 4:
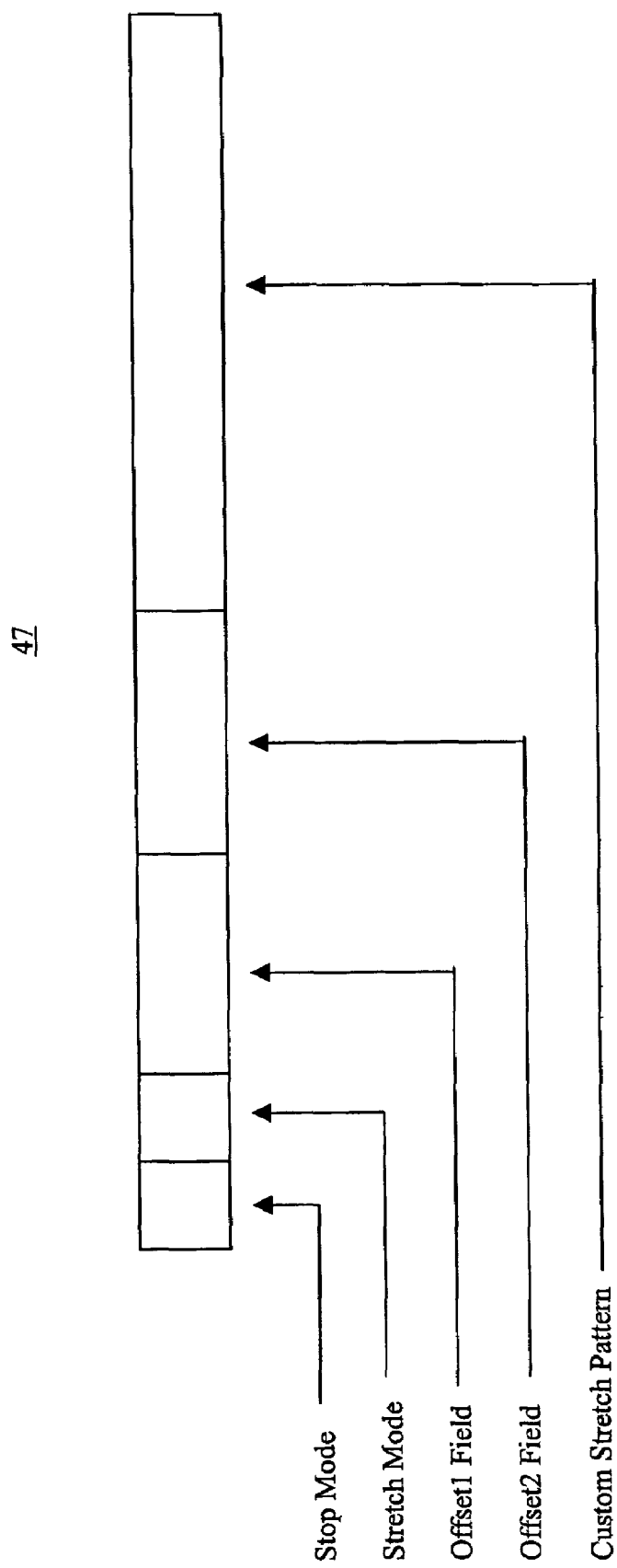
FIG. 4 is a diagram of one embodiment of a clock control register.

FIG. 4 is a diagram of one embodiment of clock control register 47. In the embodiment shown, clock control register 47 is used to select a mode of operation for the internal clock signal. Various modes may include a stop mode and a stretch mode. Clock control register 47 also includes two offset fields, each used to delay the effect of one of the modes on the selected clock signal. These modes may be triggered during a test routine by a stimulus from test data unit 50 of test system 10, and influenced by the two offset fields in clock control register 47. Clock control register 47 also includes a custom stretch pattern field which may be used to define the clock stretching behavior during a test routine.

Figure 5A:
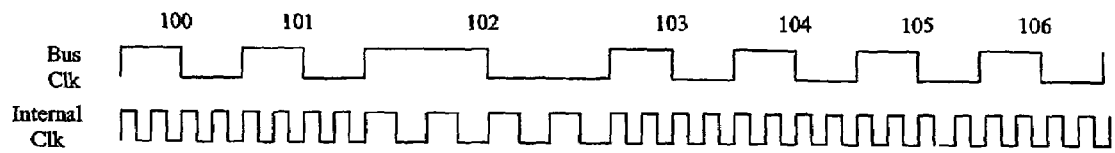
FIG. 5A is a timing diagram illustrating one embodiment of a stretch mode.

Referring now to FIG. 5A, a timing diagram illustrating one embodiment of a stretch mode is shown. In this particular example, a stretch mode referred to as dummy stretch mode is illustrated. In one embodiment, the dummy stretch mode may be invoked by a signal conveyed to control circuit 49 over the PLL test pins (both of FIG. 3). In dummy stretch mode, every internal clock signal corresponding to a bus clock cycle is stretched. The bus clock is also stretched, in this particular example, to one half its normal frequency to keep synchronization and a 4-to-1 internal clock-to-bus clock ratio (embodiments utilizing other ratios are possible and contemplated). As shown in FIG. 5A, the bus clock signal is stretched following the rising edge of cycle 102 to one half its normal frequency, and remains stretched until the rising edge of cycle 103. Correspondingly, the internal clock signal is stretched during the same period. When the bus clock resumes operating at its normal frequency, the internal clock also resumes operating at its normal frequency.

Figure 5B:
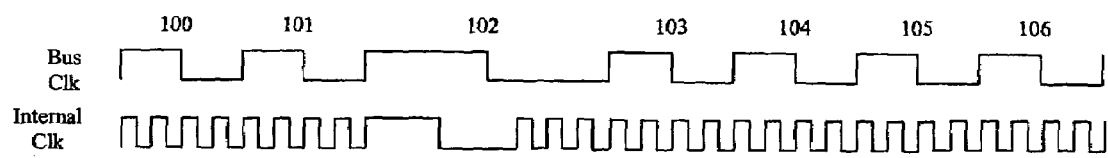
FIG. 5B is a timing diagram illustrating another embodiment of a stretch mode.

FIG. 5B is a timing diagram illustrating another embodiment of a stretch mode. In the embodiment shown, the mode referred to here as the custom stretch mode is illustrated. In the custom stretch mode, selected phases of the internal clock cycle (within the boundaries of a stretched bus clock cycle) are manipulated. In this particular example, there is a 4-to-1 internal clock-to-bus clock ratio and the bus clock is stretched for the duration of bus clock cycle 102 (other internal clock-to-bus clock ratios are possible and contemplated). The user has configured the custom stretch pattern field in clock control register 47 of FIG. 4 such that only the first internal clock of bus clock 102 is stretched, while the rest remain at their original frequency. In order to keep the same 4-to-1 internal clock-to-bus clock ratio and still keep the other three clocks in the bus clock period at their original frequency, thereby ensuring synchronous operation, the first internal clock period of bus clock cycle 102 is multiplied by four.

Broadly speaking, while in the custom stretch mode, internal clock cycles may be selectively stretched within the boundaries of any stretched bus clock cycle. The shape and location of the stretched internal clock cycles relative to the stretched bus clock cycles may be user defined. In one embodiment, the pattern of the internal clock signal during a custom stretch mode is defined by the contents of the stretch pattern field in clock control register 47, discussed above in reference to FIG. 4. This stretch pattern may be provided to the clock grid of DUT 20 through selection circuit 45 of FIG. 3. The clock grid supplies various clocked logic circuits (e.g., flip-flops or other storage elements) within the DUT.

Figure 5C:
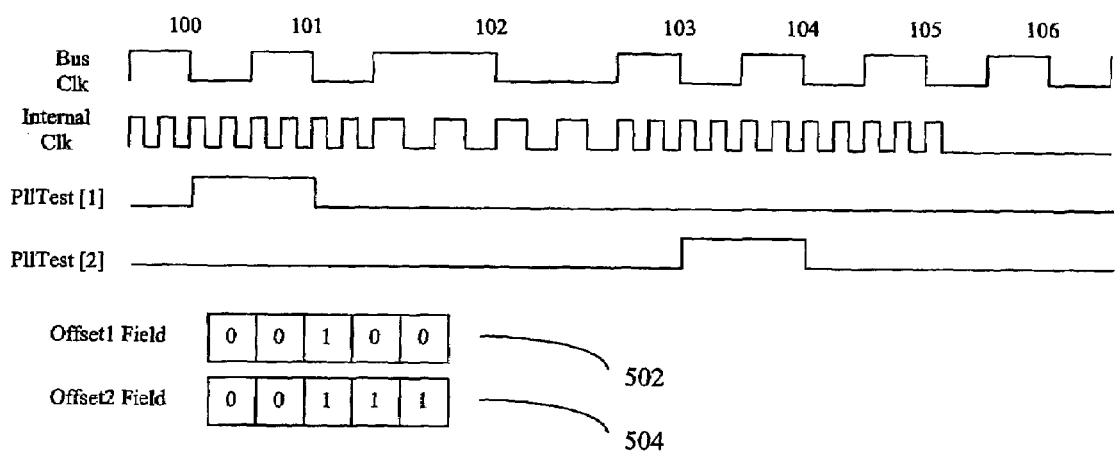
FIG. 5C is a timing diagram illustrating the function of one embodiment of offset registers in stretching and stopping an internal clock.

Turning now to FIG. 5C, a timing diagram illustrating the function of one embodiment of the offset fields in stretching and stopping an internal clock is shown. Offset1 field 502 and offset2 field 504 are included in clock register 47 shown in FIG. 4. While the PLL test pins (which are typically sampled on the rising edge of the bus clocks) may be used to trigger when during a test the various clock operations should change, these two offset fields may be used to delay the effects of the PLL test pin, as demonstrated by the timing diagram. The timing diagram illustrates an example of a stretch mode and a stop mode for a device under test in a test system.

In this particular example, the internal clock signal is operating at a speed that is four times the frequency of the bus clock signal. It is assumed that the user has already identified the first speedpath as occurring on the first internal clock corresponding to bus clock cycle 102, and the second speedpath occurs on the third internal clock cycle corresponding to bus clock cycle 105. Offset1 field is set to a value of '00100', the binary representation of 4. In this embodiment, a PLLTest[1] signal is asserted at the falling edge of bus clock cycle 100, and de-asserted at the falling edge of bus clock cycle 101. The PLLTest[1] signal is recognized by control circuit 49 on the rising edge of the bus clock in cycle 101. Due to the programming of offset1 field in this embodiment, the affect of stretching is delayed 4 internal clock cycles after the PLLTest[1] signal is recognized by control circuit 49. The bus clock is also stretched to one half it's normal frequency to keep synchronization and a 4-to-1 internal clock-to-bus clock ratio. A SIF that occurs on any of the internal clock cycles occurring within the boundaries of bus clock cycle 102 at the normal operating frequency may be masked by the cycle stretching operation, as the lower frequency allows additional time for the data in a speedpath to propagate to the next storage element. Offset2 register is programmed with a value of '00111', the binary representation of 7. At the falling edge of bus clock cycle 103, the PLLTest2 signal is asserted, and remains asserted until the falling edge of bus clock cycle 104. The PLLTest[2] signal is recognized by control circuit 49 on the rising edge of the bus clock in cycle 104. Due to the programming of offset2 field in this embodiment, the affect of stretching is delayed 7 internal clock cycles after the PLLTest[2] signal is recognized by control circuit 49. As noted above, the second speedpath occurs on the third internal clock cycle corresponding to bus clock cycle 105 for this example. Following this clock cycle, the internal clock is stopped. This could be accomplished in several ways. In one example, clock control register 47 of FIG. 4 could be reprogrammed after bus clock 102 but before bus clock 104 to operate in stop mode, rather than stretch mode, as was needed earlier to stretch the internal clock during bus clock 102. Referring back to FIG. 3, in this embodiment, stop mode may be configured such that clock control circuit 49 places a logical value of '01' on selection circuit 45, thereby coupling an electrical ground to the clock grid. Alternatively, clock control register 47 of FIG. 4 may not need to be reprogrammed to operate in stop mode if the custom stretch pattern is programmed to logical '0's. In this example, one PLL test pin could be used to dummy stretch the first order SIF at bus clock cycle 102, while the other pin is used to signal a custom stretch. Since the custom stretch pattern is programmed to logical '0's, the clock grid is coupled to an electrical ground. This may be useful if there is insufficient time to reprogram clock control register 47 between masking an earlier SIF and stopping the clocks of a later SIF. Data corresponding to the state of the device under test immediately after a speedpath occurred may then be loaded into scan chains that may be present in the device, and subsequently shifted to the test system for analysis.

Figure 5D:
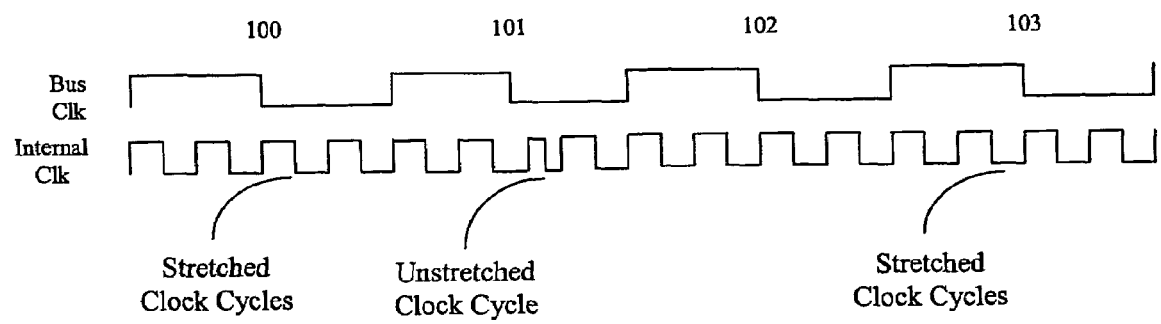
FIG. 5D is a timing diagram illustrating one embodiment of an inverse stretch mode.

Turning now to FIG. 5D, a timing diagram illustrating one embodiment of an inverse stretch mode (sometimes referred to as cycle shrinking mode) is shown. In the embodiment shown, the internal clock signal conveyed to the clock grid of DUT 20 is stretched for several cycles. For one of the cycles, a pulse at the normal clock frequency may be conveyed. In this example, the shrunken pulse of the internal clock occurs just after the falling edge of bus clock cycle 101. This is thought of cycle shrinking, since the pulse at normal clock frequency is smaller than the stretched clock pulses occurring before and after. After pulsing the clock signal at the normal frequency for a cycle, the clock signal may return to a stretched mode. It should be noted that multiple 'shrunken' pulses may be programmed in a pattern.

The inverse stretch mode (or cycle shrinking mode) may be implemented using the circuitry shown in FIG. 3. In one embodiment, this mode may be implemented by allowing a stretched clock to propagate through selection circuit 45, changing the selection to allow for a pulse at normal frequency, and then returning the selection signals to a state allowing the stretched clock signal to propagate. In another embodiment, a pattern similar to the one shown can be defined in the stretch pattern field of clock control register 47. Either of these methods may allow a clock pattern to be implemented using a single pulse at normal frequency (with the remainder of clock pulses stretched) or multiple pulses at normal frequency, which may or may not occur consecutively.

Figure 5E:
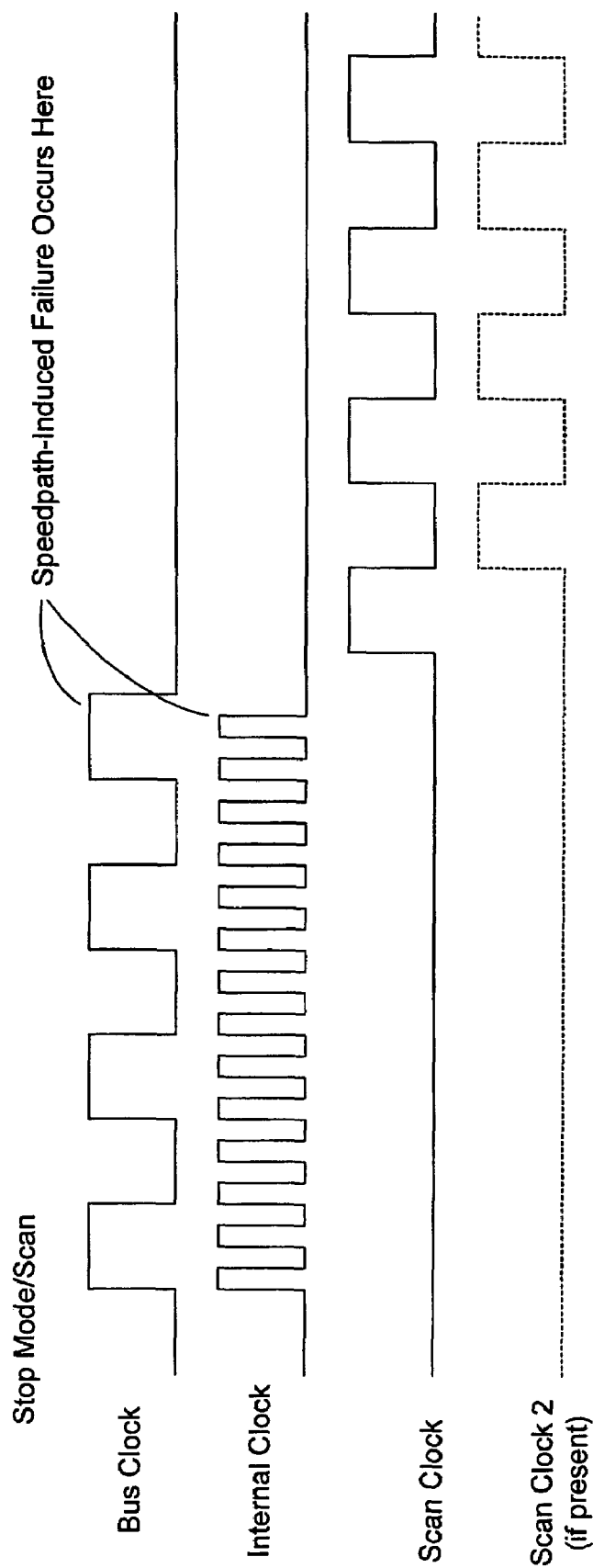
FIG. 5E is a timing diagram illustrating one embodiment of a scan dump illustrating the function of scan clocks.

FIG. 5E is a timing diagram illustrating an embodiment of a clock mode used in conjunction with capturing and retrieving the internal state of a device under test. In this example, the internal clock is stretched at the clock cycle corresponding to a first order SIF (not shown here) and is subsequently stopped at the clock cycle corresponding to the second order SIF. Following the stopping of the internal clock, the scan clock(s) may be pulsed. In this embodiment, the first scan clock pulse loads the data corresponding to the state of the device under test into the storage elements, while the subsequent scan clock pulse shifts the data into the scan chain(s). Successive scan pulse combinations eventually shift the data into the test system for analysis. Other embodiments where only one scan clock is required to shift data along the scan chain are possible and contemplated.

In one embodiment, the stopping of the clock may be performed using selection circuit 45 of FIG. 3. When stopping the internal clock is desired, the selection inputs of selection circuit 45 may be set such that the input tied to ground is selected ('01' in this particular case).

FIG. 6 is a diagram illustrating one embodiment of a test sequence. In the embodiment shown, test sequence 600 shows a series of internal clock cycles and the corresponding cycles where SIFs occur.

Because of the density of the integrated circuits that may be tested by various embodiments of a test system, failures internal to the device under test typically are not detected by the tester until one or more clock cycles after they occur due to the time it takes the fault to propagate to an external pin. In the example shown, a first internal failure (a SIF) occurs on internal clock cycle 5002 and a second internal failure (also a SIF) occurs on internal clock cycle 5011. However, corresponding pin failures (i.e. failures detected by the tester at certain output pins) may not be detected until several clock cycles later after the results of the SIF have propagated to an output pin. Thus, upon initially detecting a SIF, it may not be known exactly which clock cycle the actual failure associated with a speedpath occurred on.

Identifying the clock cycle at which the SIF occurs may be accomplished by running the test sequence in an iterative process. For the example of FIG. 6, the first SIF (internal failure #1) may be found by re-running the test sequence and performing a clock cycle stretch on clock cycle 5005, the same cycle where the SIF was observed. Since the SIF occurred earlier than clock cycle 5005, the pin failure will still appear on the tester. The test sequence may then be run again, this time performing a clock cycle stretch on the preceding clock cycle, 5004. This may be repeated for clock cycles 5003 and 5002. When the procedure is performed on clock cycle 5002, the stretching of that clock cycle will mask the SIF, and no pin failure will occur at clock cycle 5005. Thus, the SIF is identified as occurring at clock cycle 5002.

After identifying the first SIF at clock cycle 5002, the second SIF may be identified using the same procedure. The test sequence may be repeated, with the first SIF masked by stretching the clock at clock cycle 5002. For this example, the tester will identify the presence of a second SIF when a pin failure is detected at clock cycle 5014. The test sequence is repeated, masking clock cycle 5002 for the first SIF and masking clock cycle 5014, to determine if the pin failure is detected by the test system. The procedure can be repeated, masking clock cycle 5013 for the next iteration, 5012 for the next iteration after that, and clock cycle 5011 for the final iteration. Since no pin failure is detected by the test system at clock cycle 5014 when clock cycle 5011 and 5002 are stretched, the second SIF is identified as occurring on clock cycle 5011.

The procedure described above may be used to identify subsequent SIFs related to speedpaths ($3^{rd}$ order and higher) if necessary. However, if it is desired to perform analysis on the SIF occurring at clock cycle 5011, the test cycle may be run with a clock cycle stretch occurring at clock cycle 5002 (to mask the first order speedpath) and a clock stop after clock cycle 5011. The stopping of the clock may be performed using the mode discussed in reference to FIG. 5C or FIG. 5E. In addition, analysis of data corresponding to a SIF related to a speedpath of any order may be performed using methods similar to those described herein.

Figure 7:
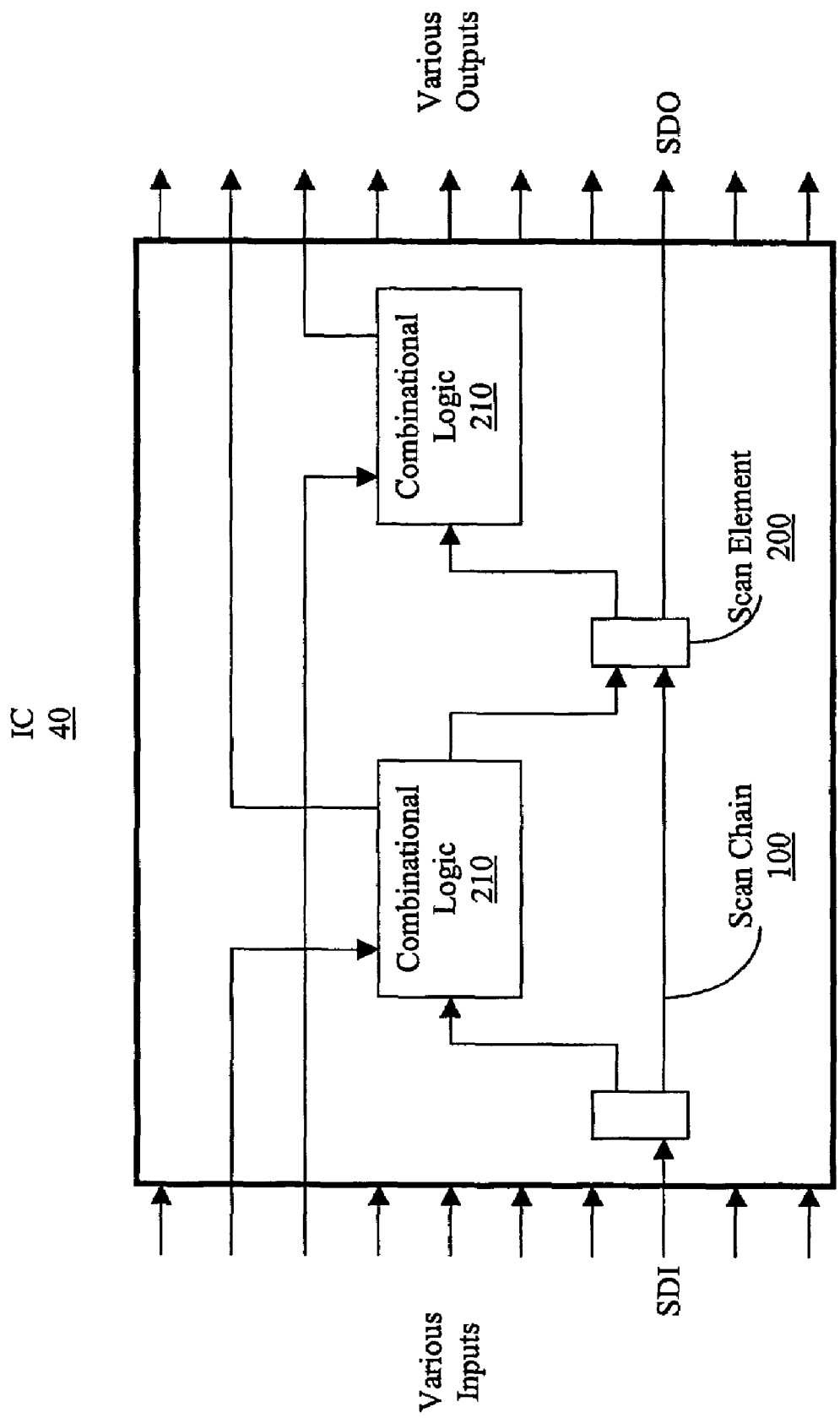
FIG. 7 is a block diagram of one embodiment of an integrated circuit having a scan chain.

Turning now to FIG. 7, a block diagram of one embodiment of an integrated circuit (IC) having a scan chain is shown. IC 40 is an exemplary circuit which may correspond to one embodiment of DUT 20 shown in FIGS. 1 and 2. IC 40 includes a scan chain 100 having a plurality of scan elements 200. For the sake of simplicity, only two scan elements in one chain are shown here. Each output of a scan element 200 is coupled to the input of the next scan element 200 in the scan chain, with the exception of the last scan element 200 which is coupled to the scan data output pin (SDO). The input to the first scan element 200 in scan chain 100 is coupled to the scan data input pin (SDI).

Embodiments of IC 40 having a plurality of scan chains 100 are possible and contemplated, and there is no theoretical limit to the number of scan chains 100 that may be present, nor is there any there theoretical limit to the number of scan elements 200 that may be present in any scan chain implemented within an IC.

Input data may be loaded into IC 40 through its various input pins. Once input data has been loaded, testing may be performed. Upon the occurrence of a SIF, the internal clock may be stopped through the method described herein and the data corresponding to the logical state of IC 40 may be captured into scan chain 100 by loading the resulting data from each block of combinational logic 210 into scan chain 100 via the input of the scan element 200 to which it is coupled. Subsequent to this loading, the output data captured in scan chain 100 may be shifted out of IC 40 and into a test system through the scan data output.

Figure 8:
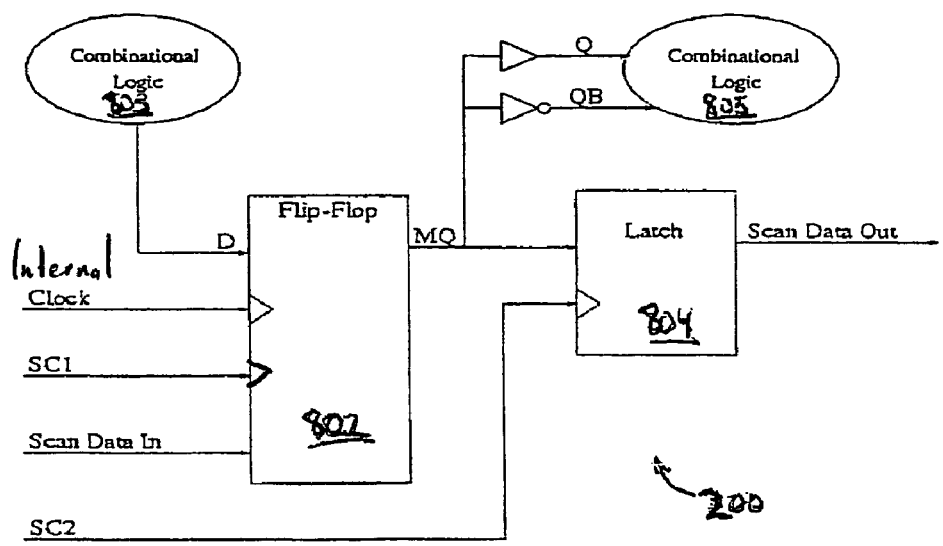
FIG. 8 is a block diagram of one embodiment of a scan element within a scan chain.

FIG. 8 is a block diagram of one embodiment of a scan element within a scan chain. Scan element 200 is one embodiment of a scan element that may be part of a chain of scan elements. Scan element 200 includes flip-flop 802 and latch 804. Flip-flop 802 is a modified D-flip-flop having a data input (D), an internal clock input (CLK) a first scan clock input (SC1), a scan data input (SDI), and an output (MQ).

When implemented in a scan chain, the scan data input may be coupled to the output of a previous scan element in the chain or may be coupled to the scan data input pin of the device in which it is implemented in the event that it is the first element in the chain. Similarly, the scan data output of latch 804 may be coupled to the scan data input of a subsequent scan element in the scan chain or may be coupled to the scan data output pin of the device in which it is implemented.

In the embodiment shown, scan element 200 is coupled to various blocks of combinational logic 210. Data from the combinational logic 210 may be captured into flip-flop 802 of scan element 200 through the D input when the internal clock signal (CLK) is pulsed.

Data may be shifted through this embodiment of scan element 200 (and thus through a scan chain in which it is implemented) by pulsing the scan clocks. Pulsing SC1 will load data into flip-flop 802 through the scan data input. The data will also appear on the MQ output of flip-flop 802. Data on the MQ output may be latched into latch 804 by pulsing SC2, and will thus appear at the scan data output of scan element 200. If the scan data output of scan element 200 is coupled to the scan data input of a subsequent scan data element in a scan chain, pulsing of SC1 will load the data into the subsequent scan element. Thus, the pulsing of SC1 loads data into scan element 200, while pulsing of SC2 latches loaded data to the scan data output of scan element 200. Therefore, for this particular embodiment, scan data can be shifted through a scan chain having a plurality of serially coupled scan elements 200 by alternately pulsing SC1 and SC2.

Scan element 200 shown in FIG. 8 is a level-sensitive scan design (LSSD) scan element. However, other types of scan elements, such as a multiplexer-D (or MUX-D) type of scan element may also be used to form a scan chain.

Figure 9:
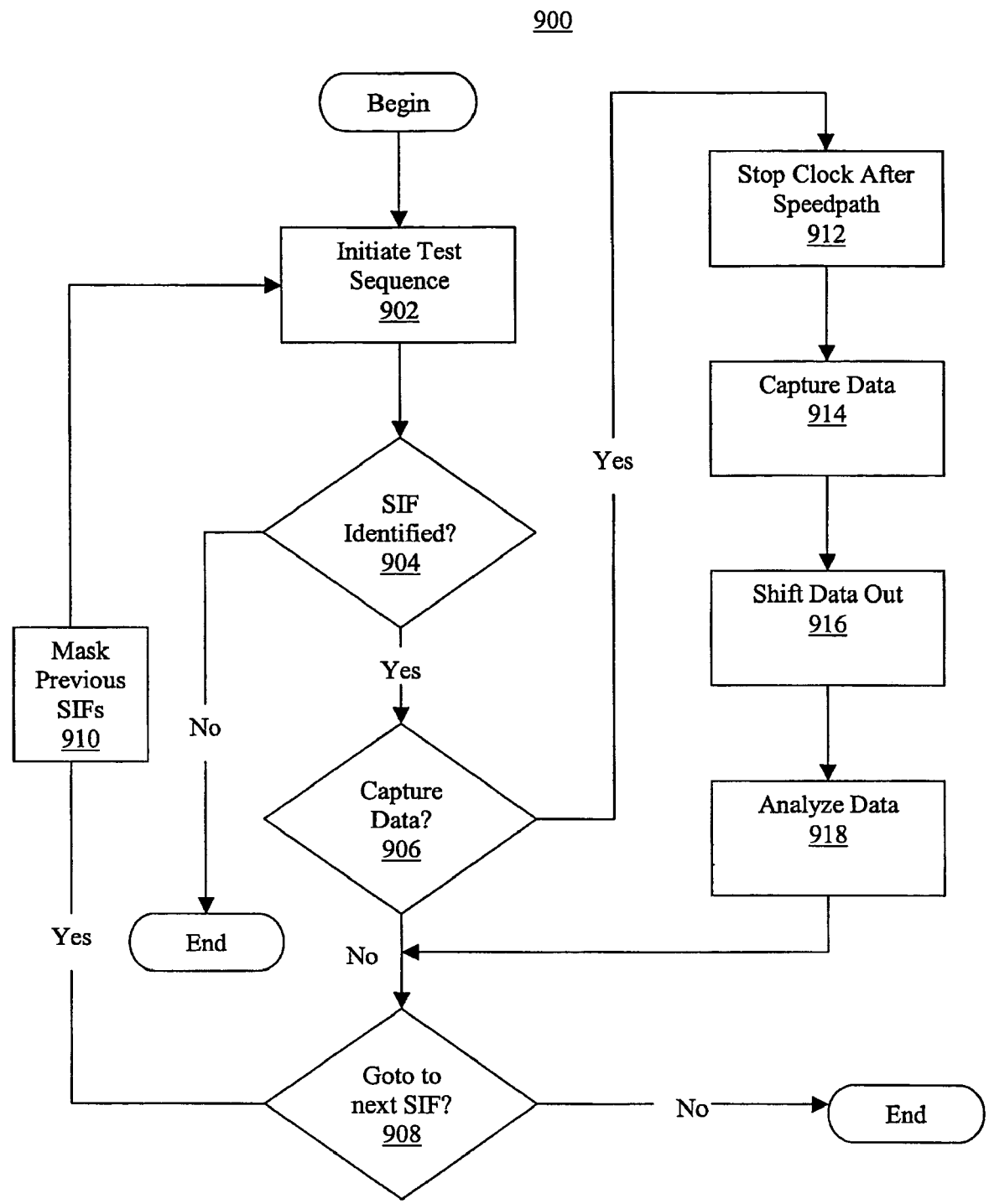
FIG. 9 is a flow diagram of one embodiment of a method for capturing the internal state of an integrated circuit for a higher order speedpath.

Turning now to FIG. 9, a flow diagram of one embodiment of a method for capturing the internal state of a processor for a higher order speedpath is shown.

In the embodiment shown, method 900 begins by initiating the test sequence (902). The pass or fail result of the test sequence is captured by test system 10, indicating whether a SIF was encountered. If a SIF was not encountered, the method ends at this point (904, NO). If a SIF occurred (904, YES), a decision is needed by the user whether the internal state of the device should be captured for the SIF in question. If the decision is made to capture the data, be it second order or higher, the internal clock may be stopped (912). The stopping of the internal clock may be performed in accordance with various methods, including that described in reference to FIG. 5C. Typically the internal clock is stopped for the clock cycle immediately subsequent to the occurrence of the SIF. After stopping the internal clock, a scan clock is needed to latch, or capture, data corresponding to the internal state of the device under test into scan elements of the one or more scan chains present (914).

After performing the data capture in 914, the captured data may be shifted from the device under test into the test system by pulsing the appropriate scan clocks (916). After the output data has been shifted into the test system, the data may be analyzed (918). This analysis may be useful in determining the cause of the speedpath-related failure.

After the data analysis, or in the event the data capture and analysis process was bypassed, a decision is needed to continue searching for higher order SIFs. If the decision is to discontinue characterization, the process ends at this point (908, NO). If the decision is made to identify higher order speedpaths, cycle stretching is invoked to mask the lower order speedpaths (910).

An internal clock signal produced by a PLL or other type of clock generation circuitry may be provided to the clock grid of the DUT, thereby causing the DUT's various logic circuits to operate. At the internal clock cycle of a SIF corresponding to the first order speedpath, the external and internal clocks may be stretched (910) by temporarily reducing their frequency. Various modes of operation may be used in stretching the clock cycles, such as the dummy stretch mode illustrated in FIG. 5A. The stretching of the clocks at the clock cycle corresponding to the first order SIF effectively masks the SIF. By masking the SIF, the circuitry that causes the failure when the clocks are running at a faster speed functions correctly at the lower clock speed. Thus, any resulting state of the device under test is not compromised by the circuitry that causes the first order SIF as it would be if the clock were operating at its original speed. The masking process can be performed for all previously identified speedpaths so that the next higher order speedpath can be identified by initiating the test sequence once again (902).

Method 900 may be repeated to identify any speedpath-related failure. This may allow for redesigns to correct all speedpath-related failures (both first-order and higher-order) to be performed in a single silicon revision.

Figure 10:
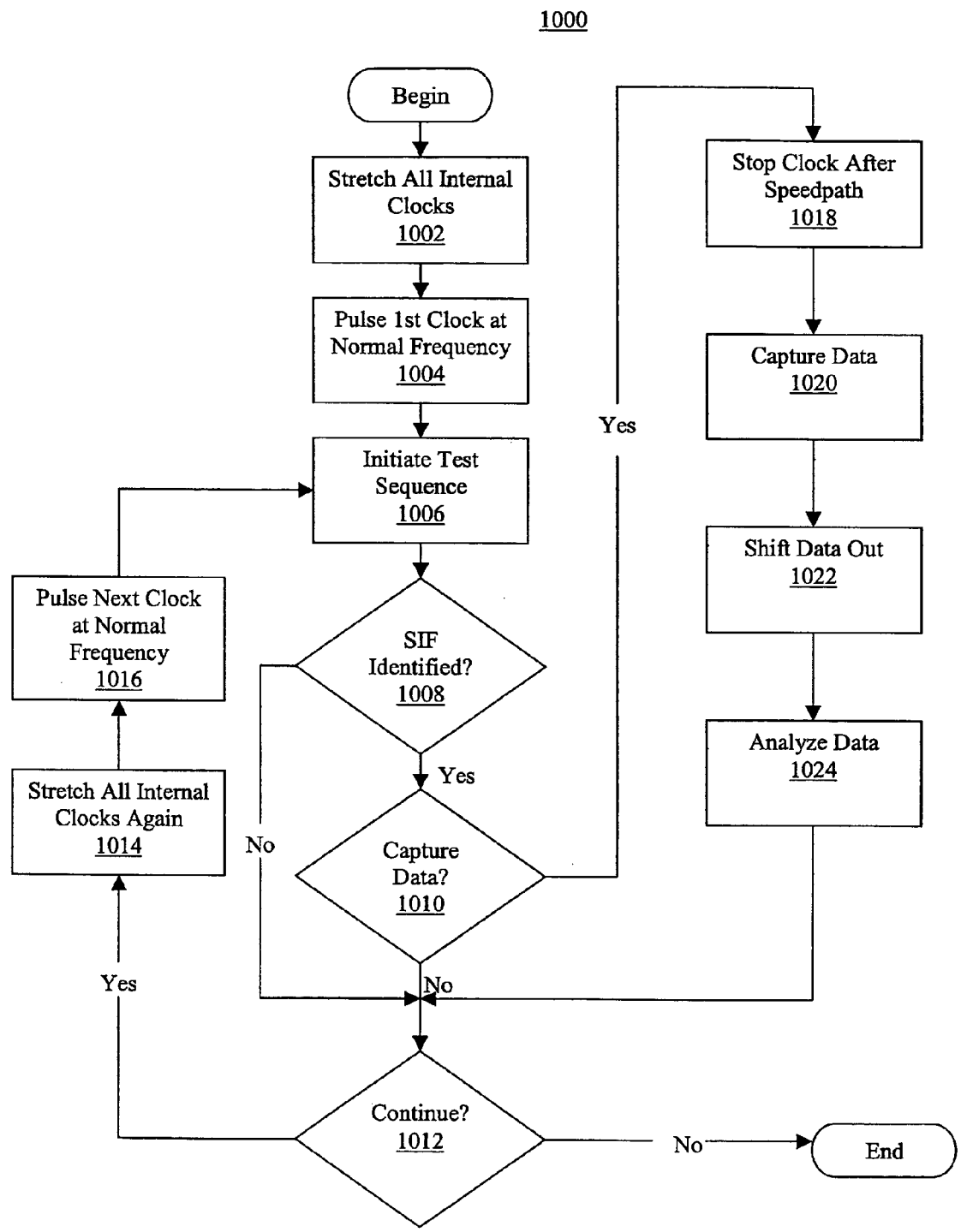
FIG. 10 is a flow diagram of one embodiment of a method for testing and an integrated circuit for higher order speedpaths using an inverse cycle-stretching technique.

FIG. 10 is a flow diagram of a one embodiment of a method for testing and capturing the internal state of an integrated circuit for a higher order speedpath using an inverse cycle-stretching technique (also known as cycle shrinking). Method 1000 may be used for determining the presence of a SIF, verifying the presence of the SIF, and if desired, to capture the internal DUT state associated with the SIF.

Method 1000 begins with all of the internal clocks configured to be stretched (1002). That is, the internal clock signal may by cycled at a frequency that is less than the normal operating frequency or a desired frequency of operation. For example, if it is desired to operate the DUT at a normal frequency of 2.0 GHz, the test sequence may be run with the internal clock frequency at one half of that, or 1.0 GHz. Performing the test sequence at this lower frequency may mask some SIFs that may otherwise occur when the clock is running at its normal frequency. Once all of the internal clocks have been stretched, the first internal clock in the test sequence is configured to operate at the normal frequency (1004). Using the above example, the first clock would operate at a frequency of 2.0 GHz, which may be at risk of inducing a SIF if a speedpath were exercised during the first clock. Once all the clocks have been configured properly, the test sequence is initiated (1006).

The pass or fail result of the test sequence is captured by test system 10, indicating whether a SIF was encountered. If a SIF was not encountered, the method jumps to a decision of whether to continue searching for SIFs (1008, NO). If a SIF occurred (1008, YES), a decision is needed by the user whether the internal state of the device should be captured for the SIF in question. If the decision is made to capture the data, the internal clock may be stopped (1018). A scan clock is needed to latch, or capture, data corresponding to the internal state of the device under test into scan elements of the one or more scan chains present (1020). The captured data may be shifted from the device under test into the test system by pulsing the appropriate scan clocks (1022). After the output data has been shifted into the test system, the data may be analyzed (1024). This analysis may be useful in determining the cause of the speedpath-related failure.

After the data analysis, or in the event the data capture and analysis process was bypassed, a decision is needed to continue searching for higher order SIFs. If the decision is to discontinue characterization, the process ends at this point (1012, NO). If the decision is made to continue (1012, YES), the internal clock operating at normal speed, or cycle shrunk as it is sometimes referred to, is configured to stretch once again such that all of the internal clocks are configured to stretch (1014). The next clock cycle adjacent to the previously shrunk cycle is then shrunk so that it is configured to operate at the normal frequency (1016). The test sequence may be repeated to determine whether a speedpath corresponding to the next clock cycle is exercised, and thus identified. This method can be repeated until all of the speedpaths in the test sequence have been identified.

Figure 11:
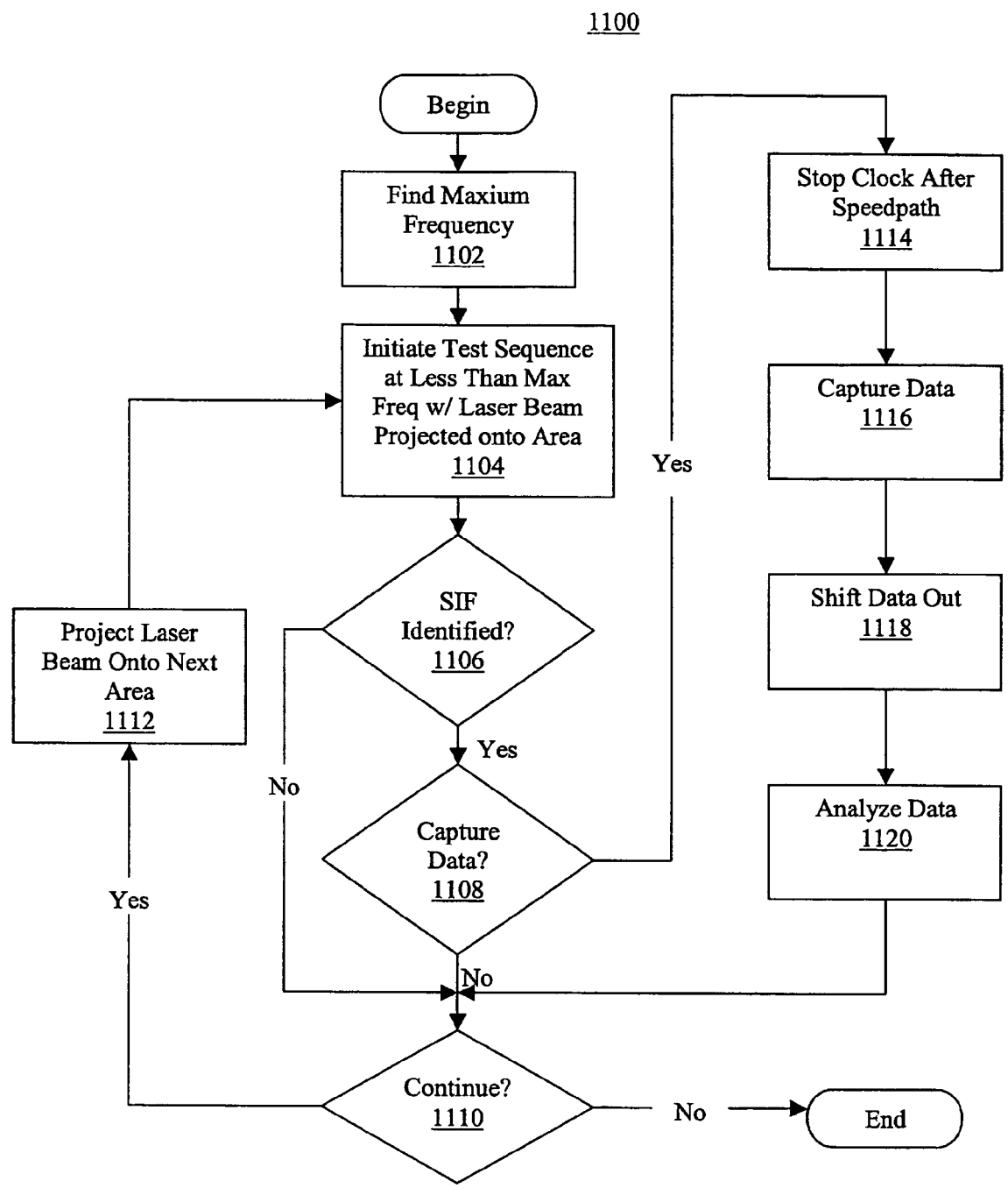
FIG. 11 is a flow diagram of one embodiment of a method for combining the testing and capturing of the internal state of an integrated circuit for a higher order speedpath, in combination with a use of a laser.

FIG. 11 is a flow diagram of one embodiment of a method combining the testing and capturing of the internal state of an integrated circuit for a higher order speedpath, in combination with the use of a laser. In one embodiment, the laser may be used to induce localized heating, although it should be noted that embodiments employing devices other than a laser to induce localized heating are possible and contemplated. In another embodiment, the laser may also be used to create electron hole pairs for the identification of SIFs.

Method 1100 begins with the running of a test sequence at various frequencies, as in a binary search, to determine the maximum frequency the device can operate before a SIF occurs (1102). It should be noted that, for at least portions of the test of 1102, internal clock cycles may be stretched in order to mask lower order SIFs when it is desired to analyze the heat-sensitivity of a higher order (i.e. $2^{nd}$ order or greater) SIF. After determining the frequency at which the failure occurs, the test is repeated at a lower frequency (1104). The frequency at which the test is performed in 1104 is typically just slightly lower than the maximum frequency the device can operate before a SIF occurs, as determined in 1102. For example, if the maximum internal clock frequency that the device can operate before a SIF occurs is 1951 MHz in 1102, the test may be performed at an internal clock frequency of 1950 MHz in 1104. In general, the idea is to perform the test in 1104 at a clock frequency that is just under the pass/fail threshold.

In addition to performing the test at the reduced internal clock frequency, the test in 1104 is also performed with a laser beam projected onto an area of the DUT. As noted above in reference to FIG. 2, the test system may include a laser that produces a laser beam for projection onto the DUT. Projecting a laser beam of a certain wavelength onto an area of the DUT may cause localized heating, and the localized heating may change the traits of circuitry in that area and thus alter its performance. A laser beam of a different wavelength may create electron hole pairs, also altering the behavior of the circuitry subject to the beam. The use of a laser beam in either of these cases may help identify a SIF, as well as providing additional information about the SIF.

The pass or fail result of the test sequence is captured by test system 10, indicating whether a SIF was encountered. If a SIF was not encountered, the method jumps to a decision of whether to continue searching for SIFs (1106, NO). If a SIF occurred (1106, YES), a decision is needed by the user whether the internal state of the device should be captured for the SIF in question. If the decision is made to capture the data, the internal clock may be stopped (1114). A scan clock is needed to latch, or capture, data corresponding to the internal state of the device under test into scan elements of the one or more scan chains present (1116). The captured data may be shifted from the device under test into the test system by pulsing the appropriate scan clocks (1118). After the output data has been shifted into the test system, the data may be analyzed (1120). This analysis may be useful in determining the cause of the speedpath-related failure.

After the data analysis, or in the event the data capture and analysis process was bypassed or a SIF was not identified, a decision is needed to continue searching for higher order SIFs. If the decision is to discontinue characterization, the process ends at this point (1110, NO). If the decision is made to continue (1110, YES), the laser is moved as to project the laser beam onto another geographic area (1112). After moving the laser, the test of 1104 is repeated. This method may continue, with the laser stepping through a number of geographic areas of the DUT until the test has been conducted with localized heating in each desired area.

Using the laser to provide localized heating on the DUT may be particularly useful in identifying heat-sensitive logic. As previously noted, the performance of various types of circuitry may be degraded at higher operating temperatures. Thus, identifying heat-sensitive logic is often associated with identifying speedpaths that are likely to cause SIFs. By running the test at an internal clock frequency where the test normally passes (but fails when localized heating provided by the laser beam is present), heat-sensitive circuitry may be identified. Furthermore, if the laser beam is projected onto a small enough area of the DUT, the physical location of the heat-sensitive logic may be identified.

As also noted above, the laser may be used to create electron hole pairs. This may be accomplished by operating the laser at a different wavelength than that used for localized heating. The creation of the electron hole pairs may alter the performance of circuitry upon which the laser beam is focused. In some cases, the circuitry may perform better than it would without the laser-induced creation of electron holes. Running repeated tests on processor at different clock speeds using this technique may help verify the location of a circuitry that causes a SIF. For example, the processor may be operated at a frequency where a SIF occurs, followed by a second test at the same frequency with the laser inducing electron hole pairs in the suspected circuitry. A passing result on the second test may indicate that the circuitry for which the electron hole pairs were induced is the cause of the SIF.

It is also noted that method 1100 may be combined with the various techniques of cycle stretching discussed above. Tests similar to those of step 1102 and 1104 may be performed in conjunction with the various cycle stretching techniques discussed above in order to mask SIFs associated with lower order speedpaths if it is desired to identify heat-sensitive logic potentially associated with a higher order SIF.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method of testing an integrated circuit, the method comprising:
    stretching one or more cycles of an internal clock signal in order to mask a first order speedpath-induced failure (SIF), wherein the internal clock signal is restored to operating at a normal speed subsequent to masking the first order SIF;
    stopping the internal clock signal at a cycle corresponding to a higher order SIF; and
    loading test output data into a scan chain.

2. The method as recited in claim 1 further comprising masking a second order SIF, wherein the higher order SIF is 3rd order or greater.

3. The method as recited in claim 1, wherein the higher order SIF is a second order SIF.

4. The method as recited in claim 1, further comprising inputting an external clock signal into the integrated circuit, wherein a frequency of the internal clock signal is a multiple of a frequency of the external clock signal.

5. The method as recited in claim 4 further comprising stretching the external clock cycle simultaneously with said stretching of one or more internal clock cycles.

6. The method as recited in claim 5, wherein said stretching one or more internal clock cycles comprises stretching each of the one or more internal clock cycles for a predetermined duration.

7. The method as recited in claim 5, wherein said stretching one or more internal clock cycles comprises stretching selected ones of the one or more internal clock cycles for a predetermined duration.

8. The method as recited in claim 5, wherein the internal clock is stopped at an internal clock cycle that corresponds to the higher order SIF.

9. The method as recited in claim 8, further comprising:
    pulsing a scan clock signal;
    loading the test output data into the scan chain responsive to said pulsing the scan clock signal; and
    repeating said pulsing the scan clock signal in order to shift the test output data from the scan chain.

10. The method as recited in claim 1 further comprising performing localized heating on a portion of the integrated circuit.

11. The method as recited in claim 10, wherein said localized heating is performed by a laser.

12. The method as recited in claim 1 further comprising inputting one or more test vectors into the integrated circuit.

13. The method as recited in claim 1, wherein the integrated circuit is a processor.

14. The method as recited in claim 1, wherein the test output data is shifted to a test system, wherein the test system is configured to determine the presence of a failure corresponding to the higher order speedpath.

15. The method as recited in claim 1, further comprising using a laser to induce electron hole pairs in a portion of the integrated circuit.

16. A system comprising:
    a device under test (DUT), wherein the DUT includes:
        a clock generation unit, wherein the clock generation unit is configured to generate an internal clock signal;
        a clock manipulation unit, wherein the clock manipulation unit is configured to, in a first mode, output the internal clock signal at a first frequency, and in a second mode, to stretch one or more internal clock cycles, wherein operating in the second mode masks a first order speedpath-induced failure (SIF), wherein the clock manipulation unit is coupled to provide the internal clock signal to a clock grid in the DUT; and at least one scan chain, the scan chain including a plurality of scan elements;
and a test system, wherein the DUT is coupled to the test system, wherein the test system is configured to detect a higher-order SIF, and wherein the test system is further configured to receive test output data from the at least one scan chain subsequent to detecting the higher-order SIF.

17. The system as recited in claim 16, wherein the DUT is further configured to operate the clock manipulation unit in order to mask a second order SIF, and wherein the higher order SIF is 3rd order or higher.

18. The system as recited in claim 16, wherein the higher order SIF is a second order SIF.

19. The system as recited in claim 16, wherein the DUT is coupled to receive an external clock signal from the test system, and wherein stretching the internal clock signal is performed simultaneously with stretching the external clock signal.

20. The system as recited in claim 19, wherein the clock generation unit is a phase-locked loop (PLL), wherein the PLL is coupled to receive the external clock signal as a first input.

21. The system as recited in claim 20, wherein the PLL is coupled to receive a divided clock signal as a second input, wherein the divided clock signal is received from the output of a first divider circuit, and wherein the internal clock signal is an input to the first divider circuit.

22. The system as recited in claim 21, wherein the clock manipulation unit includes a second divider circuit and a selection circuit, wherein the second divider circuit is coupled to receive the internal clock signal from the PLL and further configured to provide a second divided internal clock signal as an input to the selection circuit.

23. The system as recited in claim 22, wherein the selection circuit is further coupled to receive the internal clock signal as an input, and further includes an input coupled to an electrical ground and an input coupled to receive a custom pattern.

24. The system as recited in claim 23, wherein the custom pattern is defined in a register.

25. The system as recited in claim 22, wherein the DUT further includes a control circuit, wherein the control circuit is coupled to provide selection signals to the selection circuit.

26. The system as recited in claim 21, wherein a frequency of the internal clock signal is a multiple of a frequency of the external clock signal.

27. The system as recited in claim 16, wherein said stretching of one or more internal clock cycles comprises stretching each of the one or more internal clock cycles for a predetermined period of time.

28. The system as recited in claim 16, wherein said stretching one or more internal clock cycles comprises stretching selected ones of the one or more internal clock cycles for a predetermined period of time.

29. The system as recited in claim 16, wherein the DUT is configured to stop the internal clock at an internal clock cycle at which the higher order SIF occurs.

30. The system as recited in claim 29, wherein the test system is further configured to, subsequent to stopping the internal clock, pulse a scan clock signal, and wherein the DUT, responsive to pulsing the scan clock signal is configured to load test output data into the scan chain responsive to said pulsing the scan clock signal, wherein the test output data corresponds to an internal state of the DUT.

31. The system as recited in claim 30, wherein the test system is further configured to repeat pulsing the scan clock signal in order to shift the test output data from the scan chain.

32. The system as recited in claim 31, wherein the test system includes a test data unit, wherein the test system is coupled to receive the test output data from the scan chain.

33. The system as recited in claim 16, wherein the test system is configured to provide localized heating on an area of the integrated circuit.

34. The system as recited in claim 33, wherein said localized heating is performed by a laser, wherein the laser projects a laser beam on an area of the integrated circuit.

35. The system as recited in claim 16, wherein the test system is coupled to provide test input data to the DUT through one or more input pins of the DUT.

36. The system as recited in claim 16, wherein in a third mode, the clock grid receives a plurality of internal clock cycles with the internal clock operating at a second frequency and at least one pulse of the internal clock signal at the first frequency, wherein second frequency is less than the first frequency.

37. The system as recited in claim 16, wherein the DUT is an integrated circuit.

38. The system as recited in claim 37, wherein the integrated circuit is a processor.

39. The system as recited in claim 16, wherein the system includes a laser, wherein the laser is configured to induce electron hole pairs in a portion of the DUT circuitry by projecting a laser beam.

40. A method for testing an integrated circuit, the method comprising:

performing a first test of the integrated circuit, wherein the integrated circuit includes a clock grid coupled to receive an internal clock signal, wherein the internal clock signal operates at a first frequency during the first test, and wherein a failure occurs during the first test;

performing a second test of the integrated circuit, wherein the internal clock signal operates at a second frequency during the second test, wherein the second frequency is less than the first frequency, and wherein localized heating is provided to a first area of the integrated circuit during the second test;

masking a first failure during the second test, wherein said masking a failure is performed by stretching at least one internal clock cycle; and determining if a second failure occurs during the second test.

41. The method as recited in claim 40 further comprising:

providing localized heating to a second area of the integrated circuit;

repeating said performing a second test; and determining if the second failure occurs during the second test.

42. The method as recited in claim 41, wherein said localized heating is performed by a laser projecting a laser beam on the first area of the integrated circuit.

43. The method as recited in claim 42 further comprising performing the second test wherein the laser projects the laser beam onto a second area of the integrated circuit.

44. A method comprising:

testing an integrated circuit, wherein the integrated circuit includes a clock grid coupled to receive an internal clock signal, wherein during a first portion of said testing, the internal clock signal has a first frequency, and wherein during a second portion of said testing, the internal clock signal is provided at a second frequency, wherein the second frequency is greater than the first frequency;

wherein the method further includes:

masking a first order speedpath induced failure (SIF) by providing the internal clock signal at the first frequency;

continuing the test with the internal clock signal operating at the second frequency subsequent to said masking; and stopping the internal clock signal upon detection of a SIF that is second order or greater.

* * * * *

UNITED STATES PATENT AND TRADEMARK OFFICE
CERTIFICATE OF CORRECTION

| | | |
|---|---|---|
| PATENT NO. | : 7,290,188 B1 | Page 1 of 1 |
| APPLICATION NO. | : 10/930157 | |
| DATED | : October 30, 2007 | |
| INVENTOR(S) | : Spencer A. Peterson, Richard J. Wilcox and Michael P. Taborn | |

It is certified that error appears in the above-identified patent and that said Letters Patent is hereby corrected as shown below:

In the Title: (54);

Please change the title from "Method and Apparatus for Capturing the Internal State of a Processor for Second and Higher Order Speepaths" to --Method and Apparatus for Capturing the Internal State of a Processor for Second and Higher Order Speedpaths--.

Signed and Sealed this

Eleventh Day of March, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,290,188 B1 | Page 1 of 1 |
| APPLICATION NO. | : 10/930157 | |
| DATED | : October 30, 2007 | |
| INVENTOR(S) | : Spencer A. Peterson, Richard J. Wilcox and Michael P. Taborn | |

It is certified that error appears in the above-identified patent and that said Letters Patent is hereby corrected as shown below:

In the Title: (54) and Column 1, lines 1-4;

Please change the title from "Method and Apparatus for Capturing the Internal State of a Processor for Second and Higher Order Speepaths" to --Method and Apparatus for Capturing the Internal State of a Processor for Second and Higher Order Speedpaths--.

This certificate supersedes the Certificate of Correction issued March 11, 2008.

Signed and Sealed this

First Day of April, 2008

JON W. DUDAS
*Director of the United States Patent and Trademark Office*